United States Patent
Huang (10) Patent No.: US 11,600,803 B2
(45) Date of Patent: Mar. 7, 2023

(54) ORGANIC LIGHT-EMITTING DISPLAY PANEL COMPRISING CONCAVE STRUCTURE AND CONVEX MICROLENS

(71) Applicant: SEEYA OPTRONICS CO., LTD., Shanghai (CN)

(72) Inventor: Zhongshou Huang, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 108 days.

(21) Appl. No.: 17/109,371

(22) Filed: Dec. 2, 2020

(65) Prior Publication Data

US 2022/0020966 A1    Jan. 20, 2022

(30) Foreign Application Priority Data

Jul. 15, 2020  (CN) .......................... 202010681950.0

(51) Int. Cl.
    *H01L 51/52*    (2006.01)
(52) U.S. Cl.
    CPC ...... *H01L 51/5275* (2013.01); *H01L 51/5271* (2013.01)
(58) Field of Classification Search
    CPC combination set(s) only.
    See application file for complete search history.

(56) References Cited

U.S. PATENT DOCUMENTS

| | | |
|---|---|---|
| 2013/0001533 A1 | 1/2013 | Kim et al. |
| 2014/0291648 A1 | 10/2014 | Yamazaki et al. |
| 2014/0312319 A1 | 10/2014 | Kim |
| 2016/0087018 A1* | 3/2016 | Shim .................. H01L 51/5284 257/40 |
| 2018/0331326 A1 | 11/2018 | Woo et al. |
| 2021/0057678 A1* | 2/2021 | Motoyama .......... H01L 51/5271 |

FOREIGN PATENT DOCUMENTS

| | | |
|---|---|---|
| CN | 101697353 | 4/2010 |
| CN | 103943787 | 7/2014 |
| CN | 104716164 | 6/2015 |
| CN | 105514144 | 4/2016 |
| CN | 107799662 | 3/2018 |
| CN | 107863448 | 3/2018 |
| CN | 109633946 | 4/2019 |
| CN | 109935726 | 6/2019 |

(Continued)

OTHER PUBLICATIONS

First Office Action dated Jan. 20, 2022 for Corresponding Chinese Patent Application No. 202010681950.0.

(Continued)

*Primary Examiner* — Daniel Whalen
(74) *Attorney, Agent, or Firm* — Duane Morris LLP (57) ABSTRACT

An organic light-emitting display (OLED) panel includes a substrate and a light-emitting pixel array disposed on the substrate and including a plurality of light-emitting pixels, each of the plurality of light-emitting pixels includes a concave structure, a light-emitting layer, a planarization layer, and a convex microlens which are sequentially stacked up and aligned up on the substrate in such a manner that light emitted in an angle perpendicular to the light-emitting layer on the concave structure pass through an focal point of the convex microlens.

8 Claims, 9 Drawing Sheets

(56) References Cited

FOREIGN PATENT DOCUMENTS

| | | |
|---|---|---|
| CN | 209785979 | 12/2019 |
| CN | 110646977 | 1/2020 |
| CN | 110875369 | 3/2020 |
| CN | 111106155 | 5/2020 |
| JP | 2004309794 | 11/2004 |
| JP | 2019133816 | 8/2019 |
| KR | 100709194 | 4/2007 |
| KR | 20180047331 | 5/2018 |

OTHER PUBLICATIONS

Second Office Action dated Jun. 28, 2022 for Corresponding Chinese Patent Application No. 202010681950.0.

* cited by examiner (PRIOR ART)

ORGANIC LIGHT-EMITTING DISPLAY PANEL COMPRISING CONCAVE STRUCTURE AND CONVEX MICROLENS

CROSS-REFERENCE TO RELATED APPLICATION(S)

This application claims priority to Chinese Patent Application No. 202010681950.0 filed Jul. 15, 2020, which is incorporated herein by reference in its entirety.

TECHNICAL FIELD

The present disclosure relates to display technologies and, in particular, to an organic light-emitting display (OLED) panel and an OLED apparatus.

BACKGROUND

In recent years, OLED panels have gradually become the mainstream of mobile display terminal screens. An OLED panel includes a plurality of sub-pixels arranged in an array. Each sub-pixel includes a pixel driving circuit and a light-emitting layer connected to the pixel driving circuit.

Because part of the light photons emitted in a large angle from an OLED panel may not be collected by human vision system, this will cause light loss. To collect these light photons emitted in the large angle, in the related art, a micro convex lens is disposed above each OLED sub-pixel. This arrangement is based on an ideal scenario that light photons near the focal point of a convex lens will be refracted and emerged into a parallel light beam through the convex lens and then will reach to human vision system through long distance without dispersion or loss.

However, in the above arrangement, as a matter of fact, not all of the light photons emitted from a light-emitting surface with an area about the same size as an area of the convex lens can be converged and form a collimated light beam through the convex lens, since the light-emitting surface is no longer a point source. As consequence, a considerable amount of light photons emitted in the large angle will be wasted.

SUMMARY

Embodiments of the present disclosure provide an OLED panel to increase the degree of parallelism of output light and accordingly improve display brightness.

An embodiment of the present disclosure provides an OLED panel. The OLED panel includes a substrate and a light-emitting pixel array disposed on the substrate and including a plurality of light-emitting pixels.

Each light-emitting pixel includes a concave structure, a light-emitting layer, a planarization layer and a convex microlens which are sequentially stacked up and aligned up on the substrate in such a manner that light emitted in an angle perpendicular to the light-emitting layer on the concave structure passes through a focal point of the convex microlens.

In the embodiments of the present disclosure, the light-emitting pixel includes the concave structure, the light-emitting layer, the planarization layer, and the convex microlens which are sequentially stacked up and aligned up on the substrate in such a manner that light emitted in an angle perpendicular to the light-emitting layer on the concave structure passes through a focal point of the convex microlens. The light-emitting layer is conformally laminated on the concave structure that concave structure is disposed on a side of the light-emitting layer facing towards the substrate, so that through a coupling effect of the concave structure and the convex microlens, a proportion of parallel light in light outputted from the convex microlens is increased, thereby improving display brightness of the OLED panel.

DETAILED DESCRIPTION

Hereinafter the present disclosure is further described in detail in conjunction with the drawings and embodiments. It is to be understood that the embodiments set forth below are intended to illustrate and not to limit the present disclosure. Additionally, it is to be noted that for ease of description, only part, not all, of the structures related to the present disclosure are illustrated in the drawings.

Figure 1:
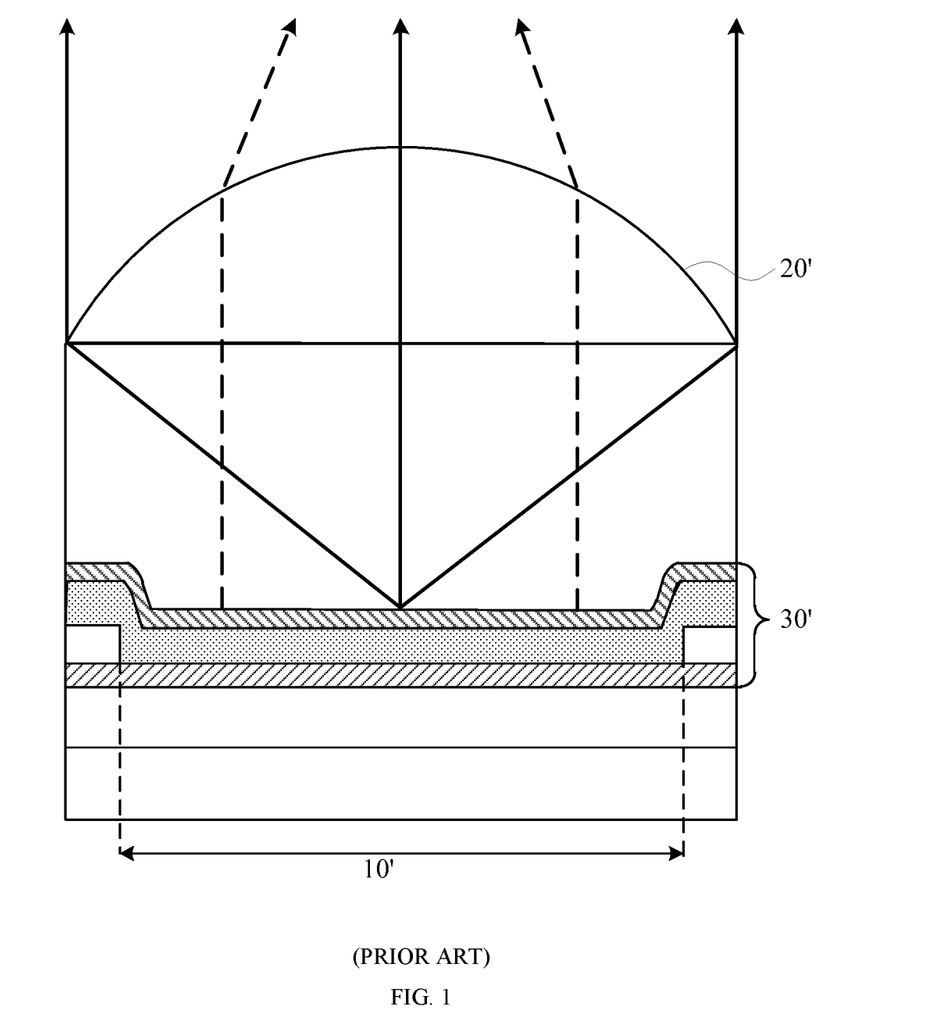
FIG. 1 shows a cross-sectional view of an OLED panel in the related art according to embodiments of the present disclosure.

FIG. 1 shows a cross-sectional view of an OLED panel in the related art. As shown in FIG. 1, a convex microlens 20' is disposed above a light-emitting pixel 10', and light photons emitted by a light-emitting layer 30' in the light-emitting pixel 10' is converged into parallel or approximately parallel light photons through the convex microlens 20' and then emitted, thereby ensuring that the parallel or approximately parallel light photons can together reach human vision system at a long distance without being scattered and lost midway. However, due to a large area of the light-emitting layer 30', merely part of the outgoing light photons emitted by the light-emitting layer 30' forms parallel or approximately parallel light photons under a focusing action of the convex microlens 20' and then is emitted, as shown by solid lines in FIG. 1. A considerable amount of light photons is still emitted in a large angle and cannot reach the human vision system, or emitted into a space outside a viewing angle of an observer, as shown by dashed lines in FIG. 1, which causes light loss.

Based on the above problem, an OLED panel is provided in the embodiments of the present disclosure. The OLED panel includes a substrate and a light-emitting pixel array disposed on the substrate and including a plurality of light-emitting pixels. Each light-emitting pixel includes a concave structure, a light-emitting layer, a planarization layer, and a convex microlens which are sequentially stacked up and aligned up on the substrate in such a manner that light photons emitted in an angle perpendicular to the light-emitting layer on the concave structure passes through a focal point of the convex microlens. The light-emitting layer is conformally laminated on the concave structure, so that the effective light-emitting area of the light-emitting layer is increased, the outgoing light photons emitted by the light-emitting layer is emitted to the convex microlens in a direction perpendicular to a tangent line to the concave curved surface, and light incident on the convex microlens are emitted out as substantially parallel light photons through a focusing effect of the convex microlens, thereby ensuring a focusing effect of light emitted from the OLED panel, and accordingly improving display brightness of the OLED panel.

The above description is the score idea of the present disclosure. Hereinafter, solutions in the embodiments of the present disclosure will be described clearly and completely in conjunction with the drawings in the embodiments of the present disclosure.

Figure 2:
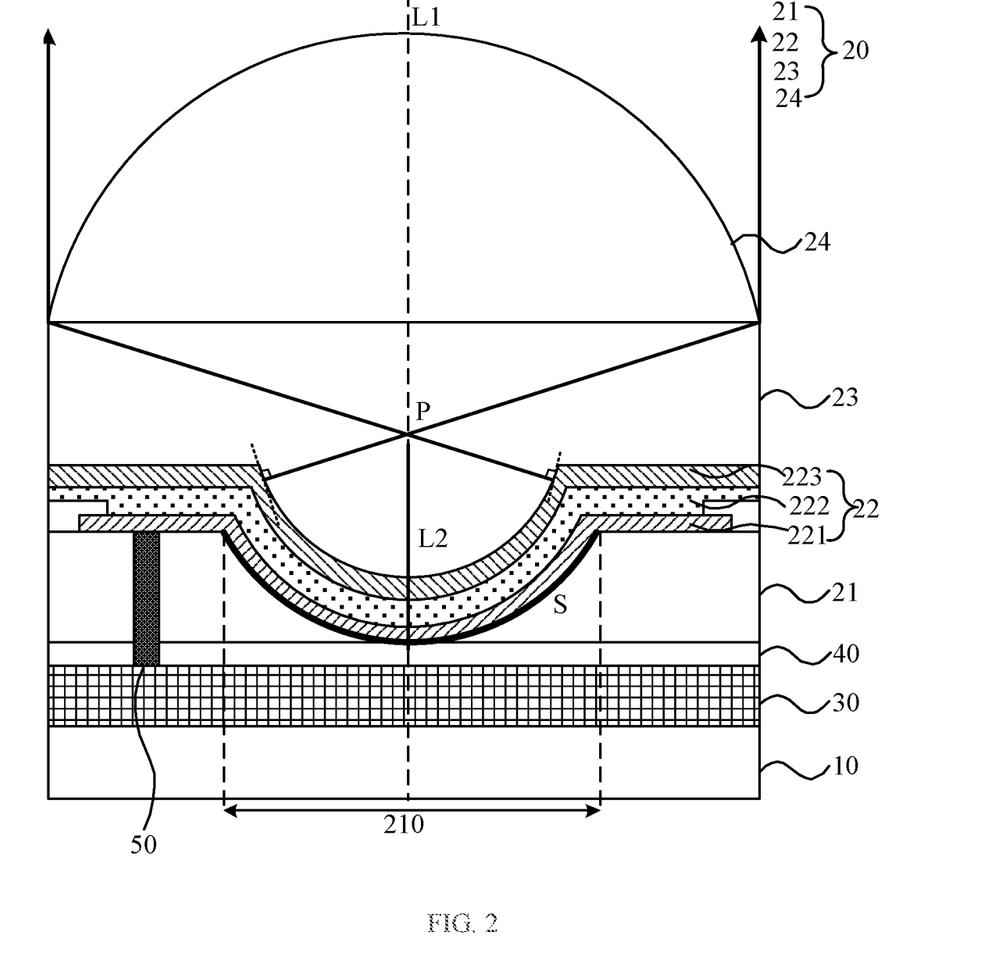
FIG. 2 shows a cross-sectional view of an OLED panel according to embodiments of the present disclosure.
Figure 3:
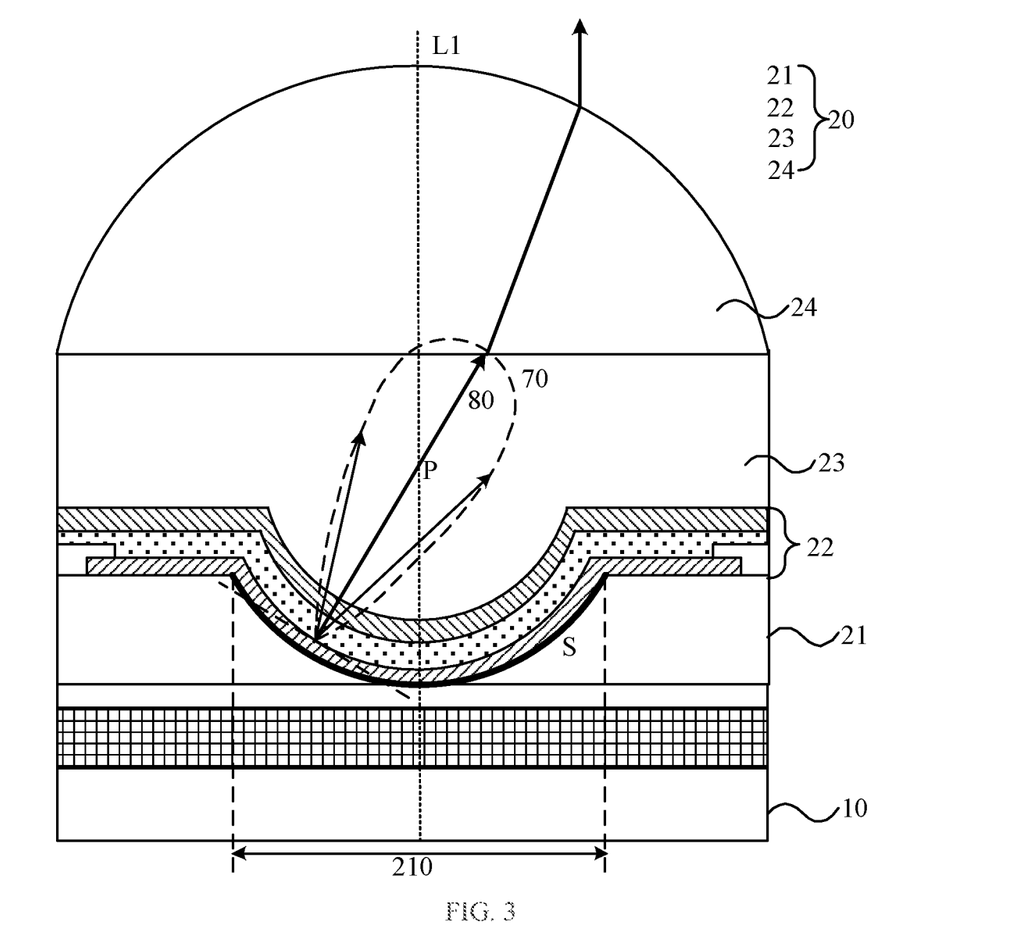
FIG. 3 shows a cross-sectional view of another OLED panel according to embodiments of the present disclosure.

FIG. 2 shows a cross-sectional view of an OLED panel according to embodiments of the present disclosure, and FIG. 3 shows a transmission route of light photons in an OLED panel according to embodiments of the present disclosure. In conjunction with FIG. 2 and FIG. 3, the OLED panel includes a substrate 10 and a light-emitting pixel array disposed on the substrate 10 and including a plurality of light-emitting pixels 20 (FIG. 2 exemplarily shows one light-emitting pixel 20). The light-emitting pixel 20 includes a concave structure layer 21, a light-emitting layer 22, a planarization layer 23, and a convex microlens 24 which are sequentially stacked up and aligned up on the substrate 10 in such a manner that light photons emitted in an angle perpendicular to the light-emitting layer 22 on the concave structure layer 21 passes through a focal point of the convex microlens 24. The concave structure layer 21 includes at least one concave structure 210 having a curved surface S with its curvature direction pointing to the substrate. The convex microlens 24 of the light-emitting pixel 20 is aligned to the concave structure 210.

As shown in FIG. 2 and FIG. 3, the concave structure 210 is disposed on the side of the light-emitting layer 22 facing towards the substrate 10, and the light-emitting layer 22 on the concave structure 210 emits light photons in various angles. Light-emitting intensities and angles of the light photons at one point of the light-emitting layer 22 are shown by a curved surface 70 in FIG. 3, and main light photons 80 emitted by the light-emitting layer 22 is mainly considered. The main light photons 80 refer to light photons perpendicular to a corresponding tangent line of a curved surface of the light-emitting layer 22 and have the greatest intensity. If the main light photons 80 emitted by the light-emitting layer 22 on the curved surface S pass through a focal point P of the convex microlens, the main light photons 80 are emitted to the convex microlens in a direction perpendicular to a tangent line to a surface of the light-emitting layer 22. After reaching the convex microlens, the main light photons 80 pass through the convex microlens and are emitted out as a substantially parallel light photons under a focusing action of the convex microlens 24. Compared with the OLED panel without the concave structure, the light-emitting layer is conformally laminated on the concave structure 210 in embodiments of the present disclosure, so that the effective light-emitting area of the light-emitting layer 22 is increased, and light photons emitted parallel by the OLED panel to human vision system is increased accordingly. In this way, the light photons emitted by the light-emitting layer is more focused and parallel after passing through the convex microlens, thereby reducing light wastes due to a failure of emitted light photons in the large angle to reach the human vision system.

It is to be noted that the arrangement of the concave structure 210 not only can converted most of the main light photons 80 emitted by the light-emitting layer 22 into parallel light photons to be emitted out, but also can effectively increase the effective light-emitting area of the light-emitting layer 22, thereby ensuring that an optical output of each light-emitting layer 22 is increased without increasing a voltage across an OLED thin film.

In the embodiments of the present disclosure, the light-emitting pixel includes the concave structure layer, the light-emitting layer, the planarization layer, and the convex microlens which are sequentially stacked up and aligned up on the substrate in such a manner that light photons emitted in an angle perpendicular to the light emitting layer on the concave structure pass through a focal point of the convex microlens. Through a coupling effect of the concave structure and the convex microlens, a proportion of parallel light photons emitted from the convex microlens can be increased, thereby improving the display brightness of the OLED panel.

In one embodiment, still referring to FIG. 2 and FIG. 3, a centerline L2 of the concave structure 210 coincides with an optical axis L1 of the convex microlens.

Furthermore, the light-emitting layer 22 and the curved surface S have a same curved surface contour.

As shown in FIG. 2 and FIG. 3, the optical axis of the convex microlens is L1, the centerline of the concave structure 210 is L2, and the optical axis L1 of the convex microlens coincides with the centerline L2 of the respective concave structure 210. When light photons in a direction perpendicular to a tangent line of a surface of the concave structure 210 is incident on the convex microlens, the light photons will be emitted into an external environment along a direction parallel to the optical axis L1 of the convex microlens. The optical axis L1 of the convex microlens coincides with the centerline L2 of the concave structure 210, which can ensure that more main light photons 80 emitted by the light-emitting layer 22 on the curved surface S pass through the focal point P of the convex microlens, increasing the optical output of the light-emitting layer 22, and then increasing the light photons emitted parallel by the OLED panel to the human vision system and reducing the emitted light photons in the large angle.

Furthermore, the light-emitting layer 22 and the curved surface S have the same curved surface contour, which can ensure that the light-emitting layer 22 and a surface structure of the concave structure 210 are completely matched, thereby ensuring a maximum light flux of the light photons emitted by the light-emitting layer 22, avoiding light losses in a process of the light photons emitted by the light-emitting layer 22 reaching the human vision system, and ensuring the display brightness of the OLED panel.

Figure 4:
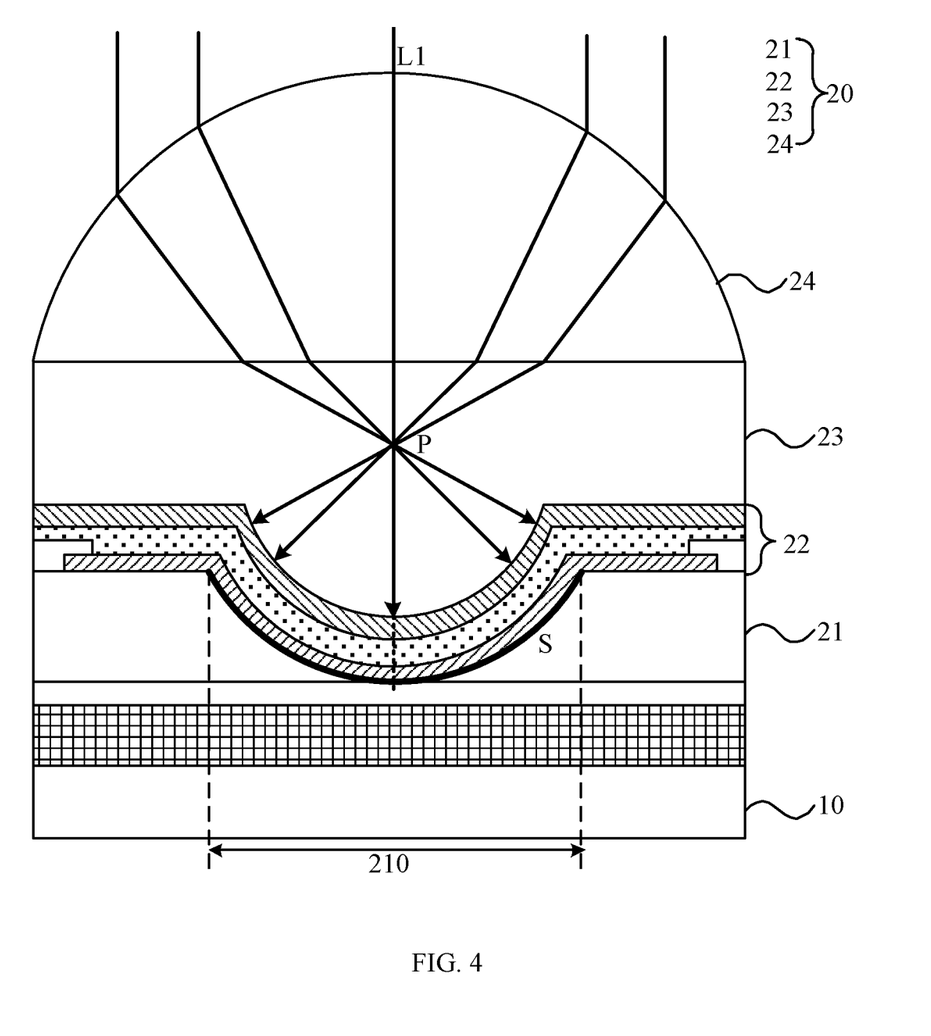
FIG. 4 shows a cross-sectional view of another OLED panel according to embodiments of the present disclosure.

In one embodiment, on the basis of the above embodiment, FIG. 4 shows a cross-sectional view of another OLED panel according to embodiments of the present disclosure. As shown in FIG. 4, the curved surface S through which the concave structure 210 is in contact with the light-emitting layer 22 satisfies that incident light photons parallel to the optical axis of the convex microlens is vertically incident on the curved surface S after an action of the convex microlens 24.

As shown in FIG. 4, assuming that a light beam is incident on a surface of the convex microlens in a direction parallel to the optical axis L1 of the convex microlens and the light beam is incident on the surface of the light-emitting layer 22 after being focused by the convex microlens, since the concave structure 210 is disposed on the side of the light-emitting layer 22 facing towards the substrate, a curvature distribution on the surface of the concave structure 210 enables the light photons focused by the convex microlens to be incident on the surface of the light-emitting layer 22 at an angle perpendicular to the surface of the light-emitting layer 22 after the light beam is incident on the surface of the light-emitting layer 22 after being focused by the convex microlens. Since the light-emitting layer and the curved surface have the same curved surface profile, the incident light photons parallel to the optical axis L1 of the convex microlens may be vertically incident on the curved surface S after the action of the convex microlens.

The light photons emitted by the light-emitting layer 22 of the OLED panel in a direction of a normal line perpendicular to a tangent plane of the curved surface is the main light photons. According to reversibility of a light path, the main light photons emitted by the light-emitting layer 22 on the concave structure 210 will be emitted through the convex microlens in a form of the substantially parallel light photons, thereby ensuring that the light photons emitted by the light-emitting layer 22 can be emitted farther and maintain a relatively large photon density, i.e., a relatively small divergence angle, and then improving a display effect of the OLED panel.

It is to be noted that FIG. 4 exemplarily shows a transmission path of light photons in the external environment which is incident on the convex microlens and then vertically incident on the surface of the light-emitting layer 22. According to a principle of reversibility of the light path, when the light-emitting layer 22 of the OLED panel emits light photons, the light photons emitted in the direction perpendicular to the tangent line of the surface of the light-emitting layer 22 pass through the convex microlens and then are emitted as an approximately parallel light photons to the external environment. The light path thereof is reserve to the light path of the light photons in the external environment which is incident on the convex microlens and will not be repeated here.

Furthermore, a shape of the concave structure 210 enables the main light photons emitted by the light-emitting layer 22 covering thereon to be emitted as the approximately parallel light photons after being focused by the convex microlens. A shape of a curved surface of the convex microlens and a shape of a curved surface of the concave structure 210 or a function relationship between the curved surfaces which satisfy the above transmission path of the light beam is within the scope of the present disclosure.

In one embodiment, still referring to FIG. 2, the OLED panel further includes a pixel driving circuit 30 disposed between the substrate 10 and the light-emitting layer 22 and an insulating layer 40 with a through hole 50 disposed between the pixel driving circuit 30 and the light-emitting layer 22. The light-emitting layer 22 further includes a first electrode 221, a light-emitting functional layer 222, and a second electrode 223 which are sequentially stacked on the concave structure 210, and the first electrode 221 is electrically connected to the pixel driving circuit 30 via the through hole 50.

As shown in FIG. 2, because of the exist of the through hole 50, the arrangement can be achieved that the pixel driving circuit 30 is electrically connected to the first electrode 221 of the light-emitting layer 22 and accordingly drives the light-emitting layer 22 via the through hole 50.

It is to be noted that a specific position of the through hole 50 is not limited in the embodiments of the present disclosure. FIG. 2 exemplarily shows that the through hole 50 does not overlap the curved surface S through which the concave structure 210 is in contact with the light-emitting layer 22, or the through hole 50 may also be disposed directly below the concave structure 210, thereby ensuring that a depth of the through hole 50 can be relatively small, and reducing a process difficulty. Furthermore, when the through hole 50 is formed, a metal organic chemical vapor deposition (MOCVD) film-forming process may be adopted, and the planarization layer may be formed while the through hole 50 is formed, so as not to affect the smoothness of the curved surface.

In one embodiment, in conjunction with FIG. 4, parallel incident light photons are converged to the focal point P after passing through the convex microlens, and a normal line to each point on the curved surface S of the concave structure 210 goes through the focal point P.

As shown in FIG. 3, light photons are emitted from the OLED panel in various angles, where the light-emitting intensities and angles thereof are shown by the curved surface 70 in FIG. 3. Light photons in the direction perpendicular to the surface of the light-emitting layer 22 are the main light photons 80 which have the greatest intensity, and the light-emitting intensity gradually decreases as an angle of the light photons increases. To enable the main light photons 80 emitted by the light-emitting layer 22 of the OLED panel to be emitted in the direction parallel to the optical axis L1 of the convex microlens, the normal line of each point on the curved surface S of the concave structure 210 goes through the focal point P of the convex microlens, thereby ensuring that the main light photons 80 are emitted in the direction parallel to the optical axis L1 of the convex microlens after passing through the convex microlens.

It is to be noted that due to subtle differences in a manufacturing process, the description that the normal line to each point on the curved surface S goes through the focal point P of the convex microlens 24 includes in practice the existence of a certain reasonable deviation, and is not an absolute concept of a zero error in mathematics.

Furthermore, a requirement of the light path shown in FIG. 4 can be satisfied through setting the focal point P of the convex microlens 24 to be located in the planarization layer 23, that is, the parallel incident light passing through the microlens is focused on the focal point P, and the parallel incident light photons are incident on the surface of the concave structure 210 in the direction perpendicular to the tangent line to the surface of the concave structure 210 after passing through the convex microlens 24.

In one embodiment, still referring to FIG. 4, a refractive index of the planarization layer 23 is smaller than a refractive index of the convex microlens 24.

Furthermore, to increase a proportion of the parallel light photons emitted in the direction parallel to the optical axis L1 of the convex microlens 24 after passing through the convex microlens 24 relative to the main light photons 80 emitted by the light-emitting layer 22 on the curved surface S, the refractive index of the planarization layer 23 is smaller than the refractive index of the convex microlens 24, so that more large-angle light photons near edges of a light-emitting surface of the curved surface S is converted into the parallel light beam to be emitted.

In the embodiments of the present disclosure, the curved surface may select different curved surface shapes according to practical design requirements. In one embodiment, still referring to FIG. 2, the convex microlens includes a plano-convex lens, where a flat surface of the plano-convex lens faces towards a side of the light-emitting layer, and an equation of a convex surface of the plano-convex lens satisfies:

$$Z(r) = f_0 - \frac{nf_0}{n+1}\left[1 - \sqrt{1 - \frac{n+1}{n-1}\left(\frac{r}{f_0}\right)^2}\,\right]$$

Z denotes an optical axis L1 of the plano-convex lens, r denotes a vertical distance from any point on the convex surface of the plano-convex lens to a Z-axis, $f_0$ denotes a focal length of the plano-convex lens, and n denotes a ratio of a refractive index n2 of a material of the plano-convex lens to a refractive index n1 of a medium outside the convex surface of the plano-convex lens, that is, n=n2/n1.

It is to be noted that the equation of the convex surface of the lens describes that the convex surface of the lens is an ellipsoid surface rotationally symmetric around the Z-axis, that is, the optical axis L1 of the plano-convex lens, a vertex of the ellipsoid surface is at a point $f_0$ on the Z-axis, and light incident on the curved surface of the plano-convex lens and parallel to the optical axis L1 is refracted and focused on a zero point of coordinate axes. Due to the characteristics of the plano-convex lens and the manufacturing process variations, the plano-convex lens practically manufactured by using a stamping die or molding a softened organic film may not be able to achieve the ideal curve equation as shown by the above formula. However, if an error of the curved surface of the formed lens is within 15%, the parallel incident light photons may be substantially expected to be focused on one point. Therefore, the curved surface within this error range is also within the scope of the present disclosure, and the same reason is also applicable to other curved surfaces and a relationship between different sizes described in the present disclosure.

Figure 5:
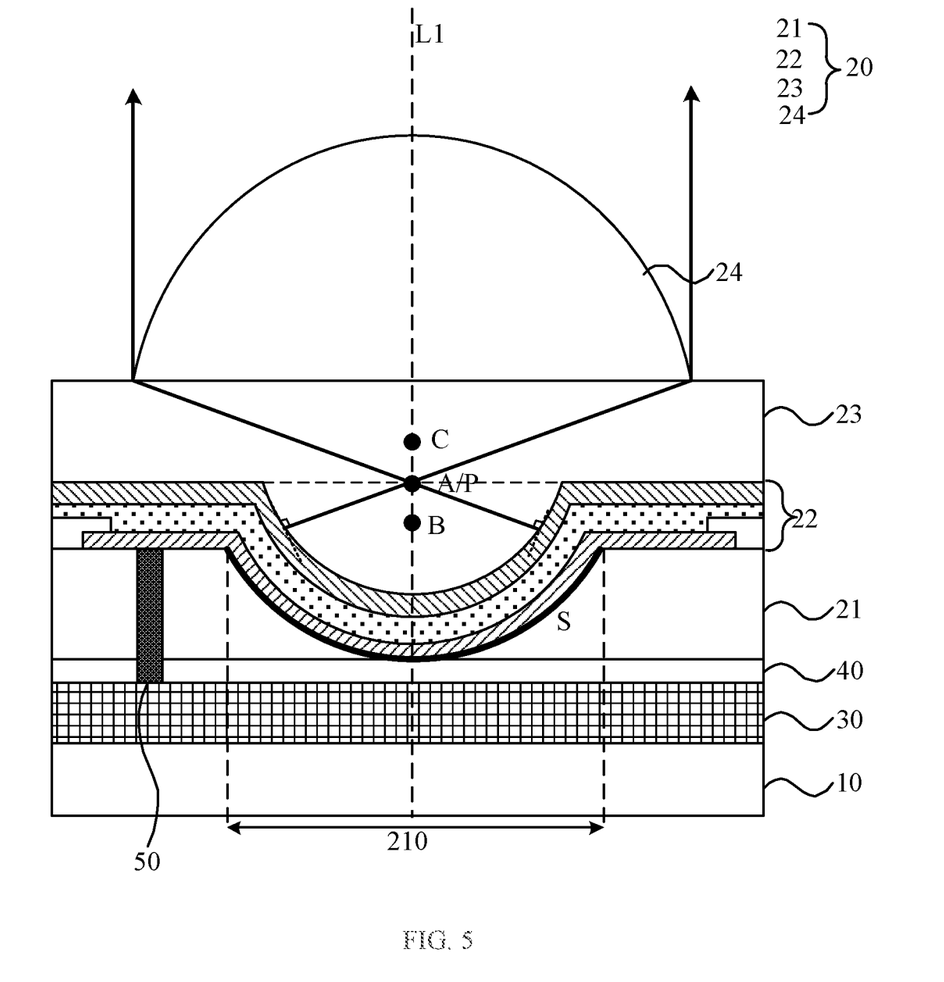
FIG. 5 shows a cross-sectional view of another OLED panel according to embodiments of the present disclosure.

In one embodiment, on the basis of the above embodiments, FIG. 5 shows a cross-sectional view of another OLED panel according to embodiments of the present disclosure. As shown in FIG. 5, the curved surface S includes a part of a spherical curved surface, a center of sphere of the spherical curved surface coincides with the focal point P of the plano-convex lens.

When the curved surface is a part of the spherical curved surface, a radius of a spherical surface is $r_0$, and an area of the light-emitting layer satisfies that $A=2\pi r_0$.

In one embodiment, still referring to FIG. 5, the center of sphere of the spherical curved surface coincides with a focal point A of green light of the plano-convex lens.

Since a refractive index of visible light in the environment depends on a wavelength of the visible light, when parallel light of different colors is incident on the convex microlens, the parallel light of different colors will be focused on different positions of the optical axis of the convex microlens after being refracted inside the convex microlens. Generally, red light has a smallest refractive index, the green light has a medium refractive index, and blue light has a largest refractive index. When parallel incident light beams of different colors pass through the convex microlens and are respectively focused on focal points B, A and C on the optical axis of the convex microlens, to ensure a better result of the OLED panel, the curved surface of the OLED panel is a part of the spherical surface, and the center of sphere is located at the focal point A of green parallel incident light passing through the convex microlens. That is, when the curved surface is a part of the spherical surface, a center of the concave structure and the focal point P of the convex microlens are set between the focal point C of the blue light and the focal point B of the red light.

It is to be noted that the green parallel incident light may be considered as light with a wavelength of 500 nm to 560 nm, for example.

In one embodiment, still referring to FIG. 2, the light-emitting layer includes the first electrode 221, the light-emitting functional layer 222, and the second electrode 223 which are sequentially stacked up on the curved surface S. The first electrode 221 includes a reflective layer capable of reflecting light.

The OLED panel includes a top emitting mode and a bottom emitting mode. When the OLED panel is in the top emitting mode and the first electrode 221 includes the reflective layer capable of reflecting light, part of the light photons emitted by the light-emitting layer 22 are reflected to the convex microlens by the reflective layer on a surface of the first electrode 221 after reaching the first electrode 221, thereby improving a light utilization rate of the OLED panel.

Figure 6:
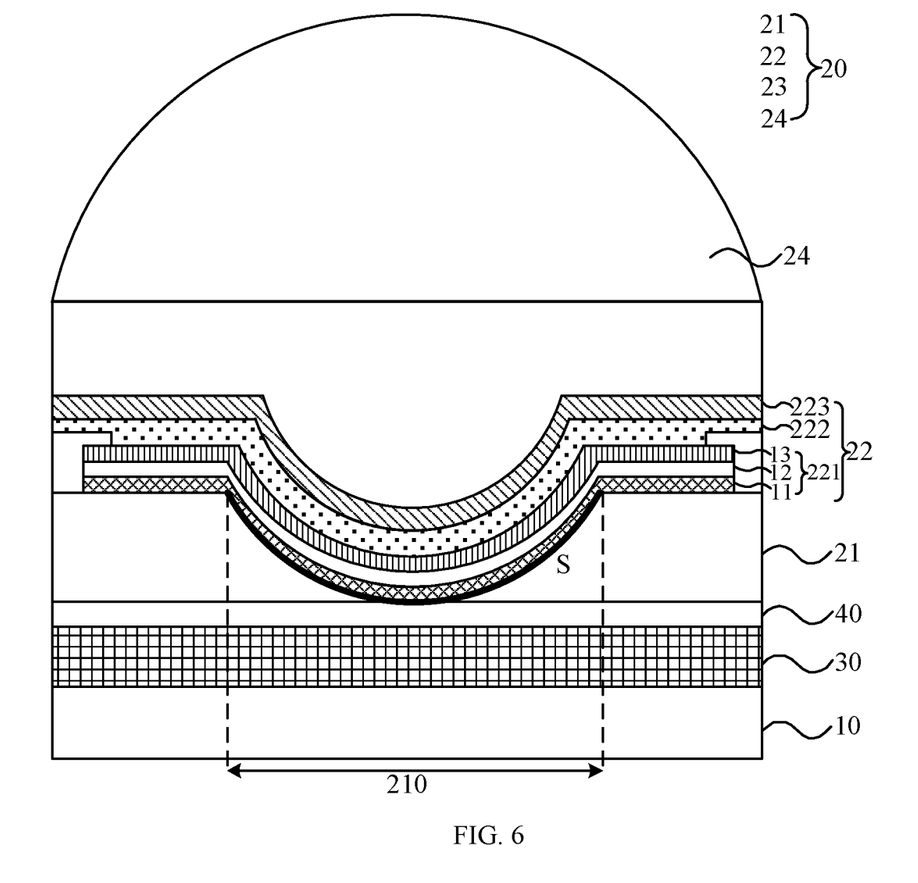
FIG. 6 shows a cross-sectional view of another OLED panel according to embodiments of the present disclosure.

Furthermore, as shown in FIG. 6, the first electrode 221 includes a first metal compound thin film 11, a metal reflective thin film 12, and a second metal compound thin film 13 which are sequentially stacked up and face away from the concave structure 210.

In the OLED panel, the first electrode 221 is generally a transparent electrode and is made of ITO. However, considering that part of the light photons emitted by the light-emitting layer 22 are emitted to a side of the substrate 10 in the OLED panel, the first electrode 221 needs to be provided with a reflective electrode layer which is generally made of a metal material, to better ensure that more light photons emitted by the light-emitting layer are emitted to a front side of the OLED panel. Since a thermal expansion coefficient of the ITO differs greatly from a thermal expansion coefficient of the metal material and the light-emitting layer 22 is disposed on the curved surface S, the curved surface S is likely to bring an additional internal stress to the first electrode. As consequence, the first electrode 221 is set to include the first metal compound thin film 11, the metal reflective thin film 12, and the second metal compound thin film 13 which are sequentially stacked up and face away from the concave structure 210, so that the first electrode 221 can serve as a reflective electrode while the internal stress brought by the curved surface S is reduced, an additional reflective layer can be avoided, and the preparation complexity of the OLED panel is reduced.

Figure 7:
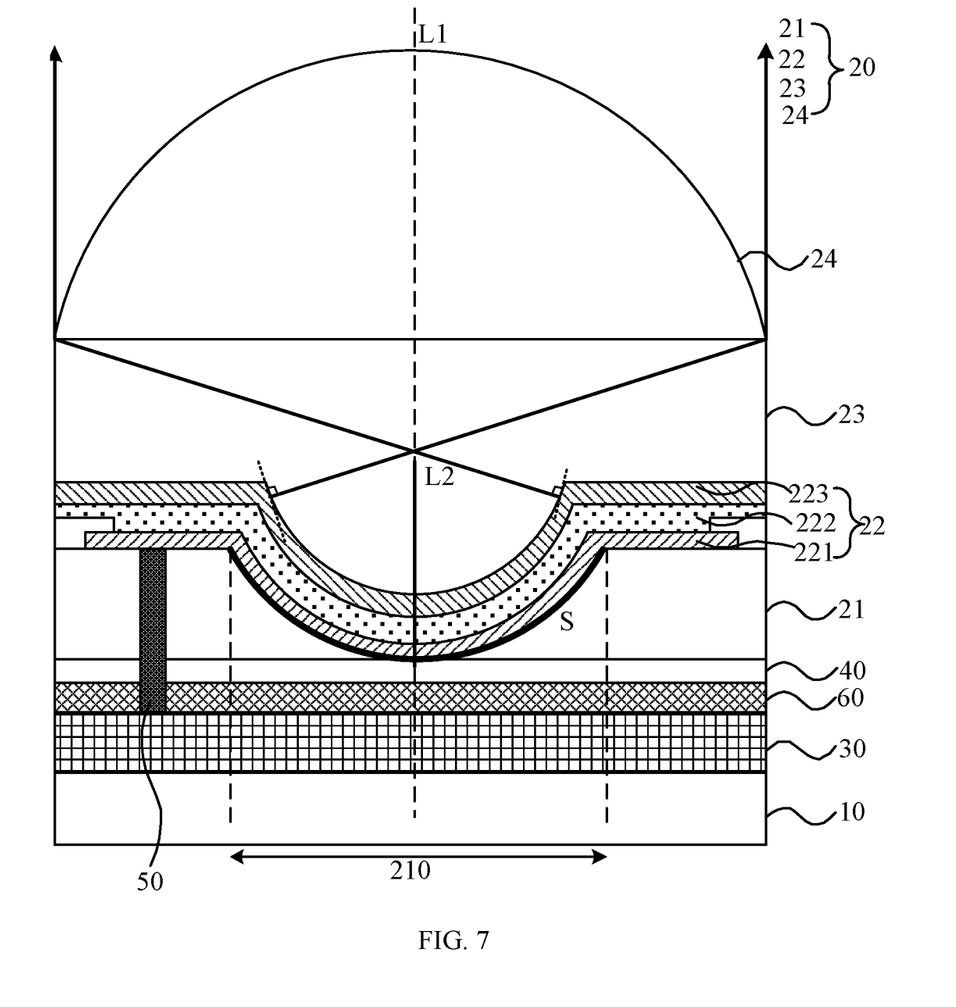
FIG. 7 shows a cross-sectional view of another OLED panel according to embodiments of the present disclosure.

In one embodiment, on the basis of the above embodiments, FIG. 7 shows a cross-sectional view of another OLED panel according to embodiments of the present disclosure. As shown in FIG. 7, the light-emitting layer 22 includes the first electrode 221, the light-emitting functional layer 222, and the second electrode 223 which are sequentially stacked up on the concave curved surface S. The first electrode 221 is the transparent electrode, and the OLED panel further includes a reflective layer 60 disposed between the concave structure 210 and the substrate 10.

As shown in FIG. 7, the reflective layer 60 may be directly disposed on a side of the concave structure 210 facing towards the substrate 10. When part of the light photons emitted by the light-emitting layer 22 reaches a back side of the OLED panel, the light photons emitted by the light-emitting layer 22 are reflected to the convex microlens by the reflective layer 60 on the substrate 10, thereby improving the light utilization rate of the OLED panel.

Figure 8:
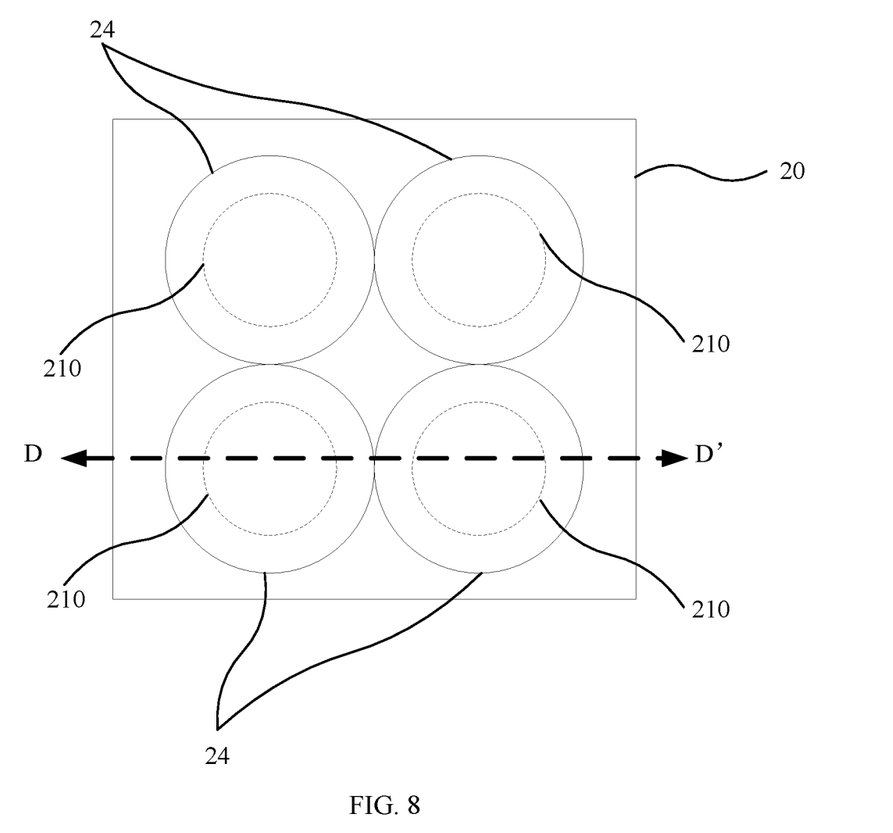
FIG. 8 shows a top view of a light-emitting pixel according to embodiments of the present disclosure.
Figure 9:
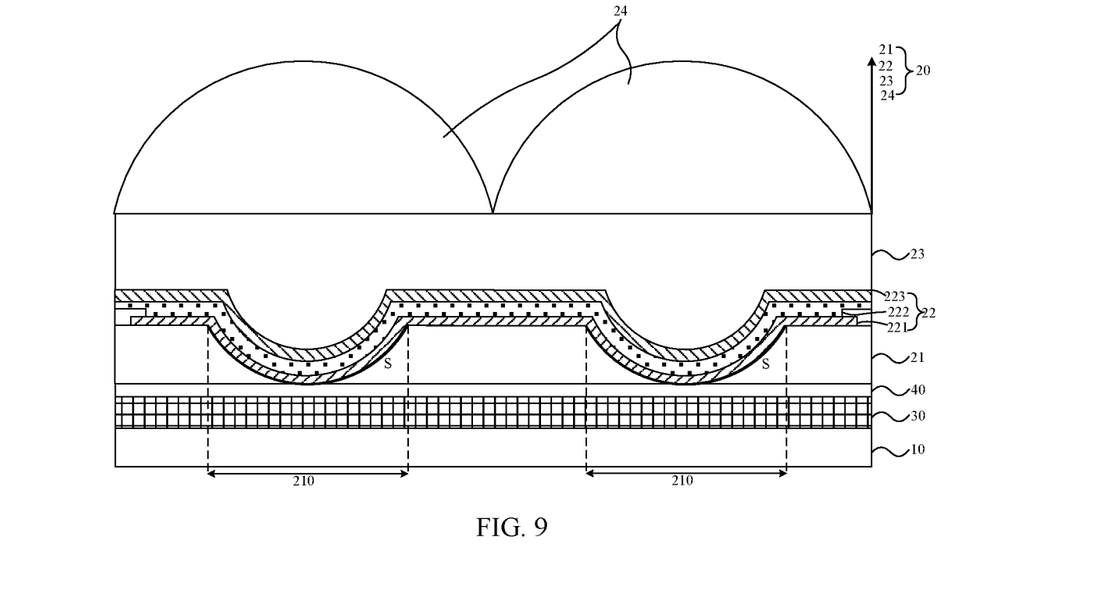
FIG. 9 shows a cross-sectional view of FIG. 8 taken along a cross section DD'.
Figure 10:
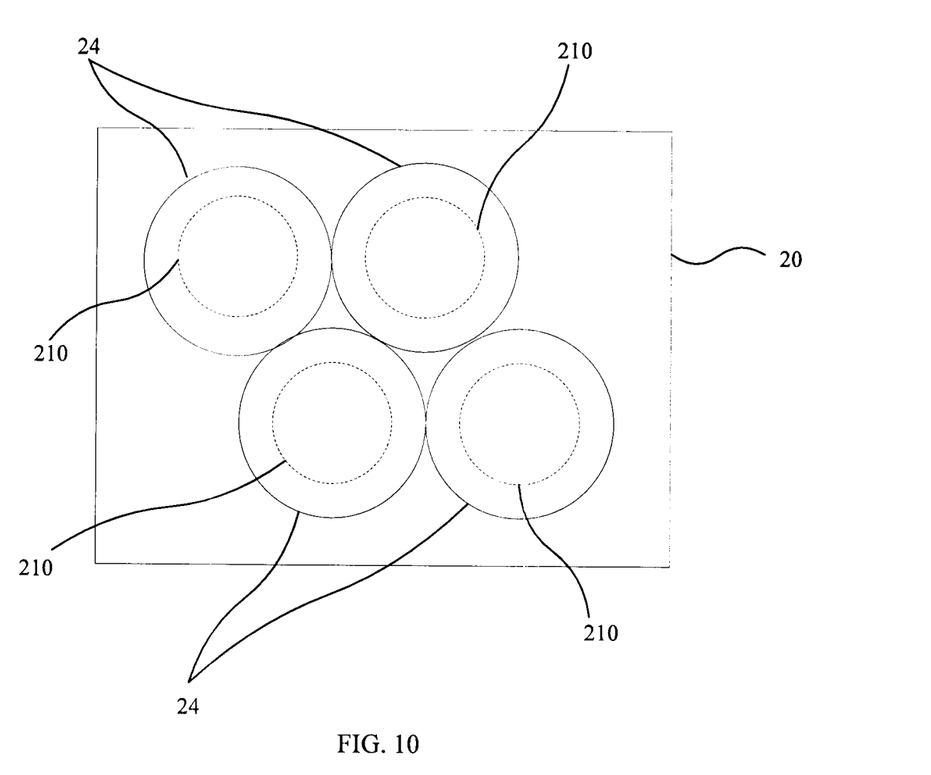
FIG. 10 shows a top view of another light-emitting pixel according to embodiments of the present disclosure.

It is to be noted that all the above embodiments and the drawings describe an example in which each light-emitting pixel includes one convex microlens and one concave structure. In other embodiments. As shown in FIG. 8 and FIG. 9, according to practical product requirements, the convex microlens structure may be configured to include at least one convex microlens, and each light-emitting pixel includes multiple convex microlenses and multiple concave structures, the microlenses are in a one-to-one correspondence to the concave structures. FIG. 9 shows a cross-sectional view of FIG. 8 taken along the cross section DD'. FIG. 8 exemplarily shows that each light-emitting pixel includes four convex microlenses and four concave structures, the four microlenses are in a one-to-one correspondence to the four concave structures. That is, the OLED panel provided by the embodiments of the present disclosure is arranged in a manner that each light-emitting pixel includes at least one convex microlens and at least one concave structure, and the at least one microlens is in a one-to-one correspondence to the at least one concave structure. An arrangement of the convex microlenses and an arrangement of the concave structures in each light-emitting pixel are not limited in the embodiments of the present disclosure. For example, they may be arranged in an array with four corners as shown in FIG. 8, that is, a row direction and a column direction of the array of the arrangement are perpendicular to each other, and every 2 rows*2 columns of convex microlenses or every 2 rows*2 columns of concave structures form a rectangle. In other embodiments, for example, they may be arranged as shown in FIG. 10, that is, an angle between the row direction and the column direction of the array of the arrangement is less than 90°, and every three convex microlenses in two adjacent rows or every three concave structures in two adjacent rows are arranged in a triangle.

Figure 11:
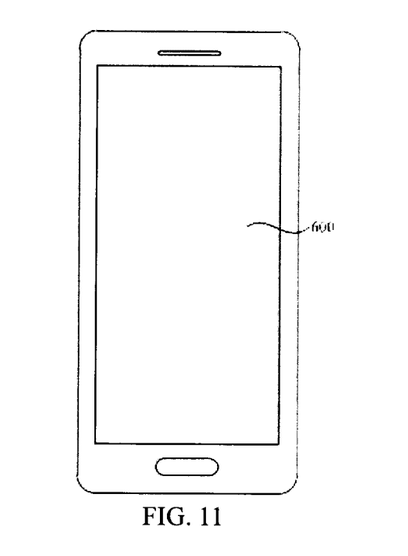
FIG. 11 shows a cross-sectional view of an OLED apparatus according to embodiments of the present disclosure.

On the basis of the above embodiments, FIG. 11 shows a cross-sectional view of an OLED apparatus according to embodiments of the present disclosure. Referring to FIG. 11, the OLED apparatus may include the OLED panel 600 provided by any one of the embodiments of the present disclosure. It is to be noted that the OLED apparatus provided by the embodiment of the present disclosure may include other circuits and devices for supporting a normal operation of the display device, and may also be a computer, a television, a smart wearable display device, etc., which is not specifically limited in the embodiment of the present disclosure.

The above detailed descriptions of the embodiments of the present invention set forth preferred modes contemplated by the inventors for carrying out the present invention at the time of filing this application, and are provided by way of examples and not as limitations. Accordingly, various modifications and variations obvious to a person of ordinary skill in the art to which it pertains are deemed to lie within the scope and spirit of the present invention as set forth in the following claims.

What is claimed is:

1. An organic light-emitting display (OLED) panel, comprising:

a substrate; and a light-emitting pixel array disposed on the substrate and comprising a plurality of light-emitting pixels;

each of the plurality of light-emitting pixels comprises a concave structure, a light-emitting layer, a planarization layer, and a convex microlens which are sequentially stacked and aligned on the substrate in such a manner that light photons emitted in an angle perpendicular to the light-emitting layer on the concave structure pass through a focal point of the convex microlens; and the concave structure comprises a rotationally symmetric curvature which comprises a portion of a spherical surface and a center of the spherical surface coincides with a focal point of green light of the convex microlens.

2. The OLED panel of claim 1, wherein a rotationally symmetric axis of the rotationally symmetric curvature coincides with an optical axis of the corresponding convex microlens in the same light-emitting pixel.

3. The OLED panel of claim 2, wherein the convex microlens comprises a plano-convex lens which has a flat surface facing towards the light-emitting layer, and a convex surface that satisfies:

$$Z(r) = f_0 - \frac{nf_0}{n+1}\left[1 - \sqrt{1 - \frac{n+1}{n-1}\left(\frac{r}{f_0}\right)^2}\right]$$

wherein Z denotes a coordinate on an Z-axis which is the optical axis of the plano-convex lens, r denotes a distance from any point on the convex surface of the plano-convex lens to the Z-axis, $f_0$ denotes a focal length of the plano-convex lens, and n denotes a ratio of a refractive index of a material of the plano-convex lens to a refractive index of a medium outside the convex surface of the plano-convex lens.

4. The OLED panel of claim 1, wherein the light-emitting layer is conformally laminated on the concave structure.

5. The OLED panel of claim 1, wherein the light-emitting pixel further comprises: a pixel driving circuit disposed between the substrate and the light-emitting layer; and an insulating layer with a through hole disposed between the pixel driving circuit and the light-emitting layer; and the light-emitting layer further comprises: a first electrode, a light-emitting functional layer, and a second electrode which are sequentially stacked on the concave structure, and the first electrode is electrically connected to the pixel driving circuit via the through hole.

6. The OLED panel of claim 1, wherein a refractive index of the planarization layer is smaller than a refractive index of the convex microlens.

7. The OLED panel of claim 1, wherein the light-emitting layer comprises a first electrode, a light-emitting functional layer, and a second electrode which are sequentially stacked up on the concave structure, and the first electrode comprises a reflective layer capable of reflecting light.

8. An OLED apparatus, comprising the OLED panel of claim 1.

* * * * *